INVENTOR.
WOLFGANG F. DIETZ
BY Eugene M. Whitacre
Attorney

INVENTOR.
WOLFGANG F. DIETZ
BY Eugene M. Whitacre
Attorney

United States Patent Office 3,449,623
Patented June 10, 1969

3,449,623

ELECTRON BEAM DEFLECTION CIRCUIT

Wolfgang F. Dietz, Indianapolis, Ind., assignor to Radio Corporation of America, a corporation of Delaware Filed Sept. 6, 1966, Ser. No. 577,375
Int. Cl. H01j 29/70, 29/74
U.S. Cl. 315—27 24 Claims

ABSTRACT OF THE DISCLOSURE

A solid state horizontal deflection circuit is provided utilizing a combination of two bidirectionally conductive switching means which serve respectively as trace and retrace switches. Each of the switching means comprises the parallel combination of a silicon controlled rectifier (SCR) and a diode. The retrace switch is triggered on shortly before the desired beginning of retrace and, in conjunction with a resonant commutating circuit, serves to turn off the trace switch thereby initiating retrace. The commutating circuit is arranged to turn off the retrace SCR before the end of retrace.

Figure 1:
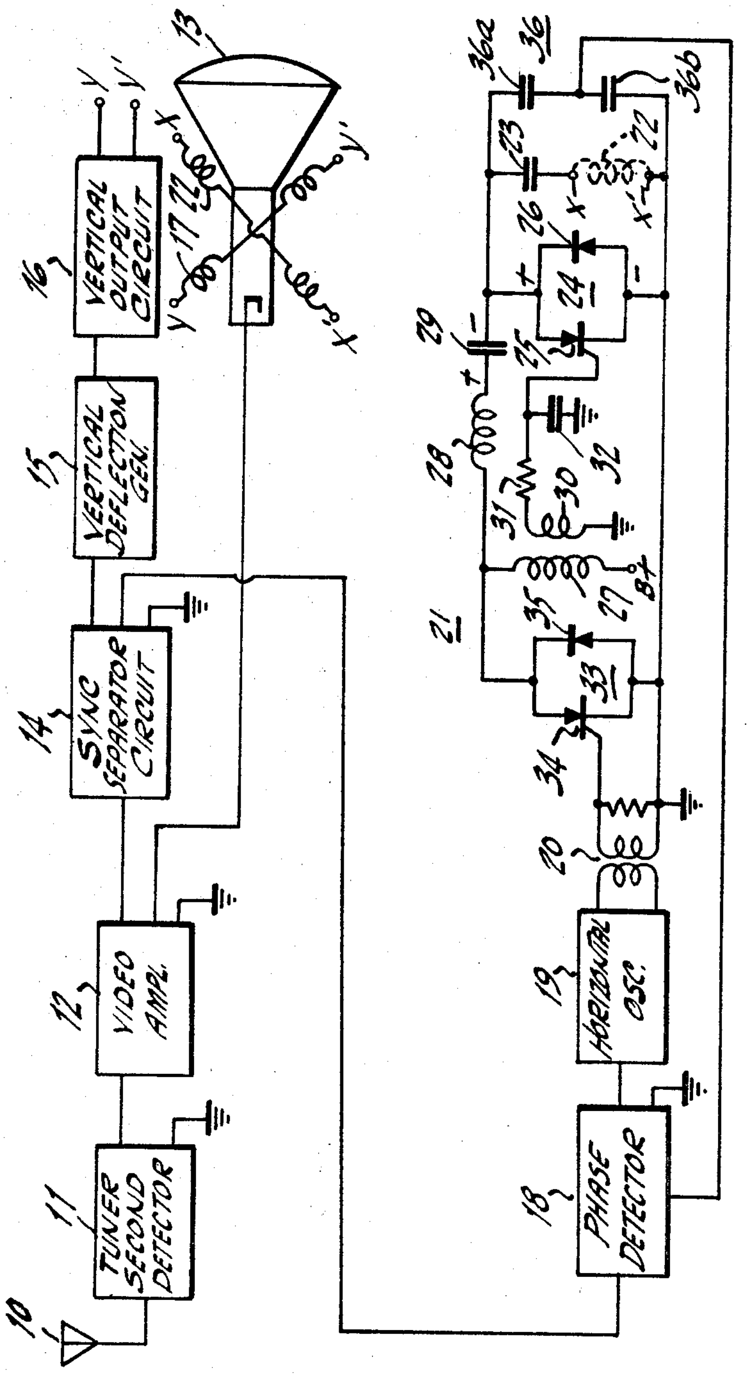

This invention relates to electron beam deflection circuits and, in particular, to a deflection circuit wherein the transfer of energy to a deflection winding is effected by means of solid state semiconductor devices such as silicon controlled rectifiers.

The invention is particularly useful in connection with horizontal deflection circuits for television receivers and will be described further in connection with use in such apparatus.

Numerous circuit designs for completely transistorized television receivers either have been incorporated in commercially available receivers or have been described in detail in various technical publications. One of the most troublesome areas in such transistor receivers, from the point of view of reliability and economy, lies in the horizontal deflection circuits.

An attempt to avoid the voltage and current limitations of transistor deflection circuits, a number of circuits have been proposed utilizing the silicon controlled rectifier (SCR), a semiconductor device capable of handling substantially higher currents and voltages than transistors.

Most SCR deflection circuits heretofore proposed are of the retrace driven type wherein a single SCR is connected to a supply during the relatively short retrace portion of the deflection cycle to replenish the energy dissipated is an associated deflection yoke or winding during the trace portion of the cycle. The retrace driven circuit is generally of lower efficiency than the more conventional trace driven circuit commonly employed in vacuum tube or transistor deflection systems. In the retrace driven circuit, a relatively high unidirectional current is passed through the SCR and associated deflection components during the retrace time and a substantially linearly varying unidirectional deflection current is passed, for example, through a diode during trace. The resulting relatively high unidirectional current produces undesirable power losses in the resistive components associated with the deflection system. In the conventional trace driven circuit, one or more active devices, which serve as a switch, conduct bidirectionally during the relatively long trace portion of the deflection cycle, replenishing energy in the yoke circuit during the latter half of trace and substantially reducing the direct current and associated power losses described above.

It is an object of the present invention, therefore, to provide a relatively high efficiency deflection circuit for television receivers utilizing reliable, high speed solid state switching devices.

It is a further object of the present invention to provide a relatively high efficiency horizontal deflection circuit for television receivers utilizing a bidirectionally conductive combination of solid state switching devices capable of withstanding high voltages and high currents.

In accordance with the invention, a low power dissipating, reliable trace driven deflection circuit utilizing solid state controlled rectifiers is provided.

Figure 2:
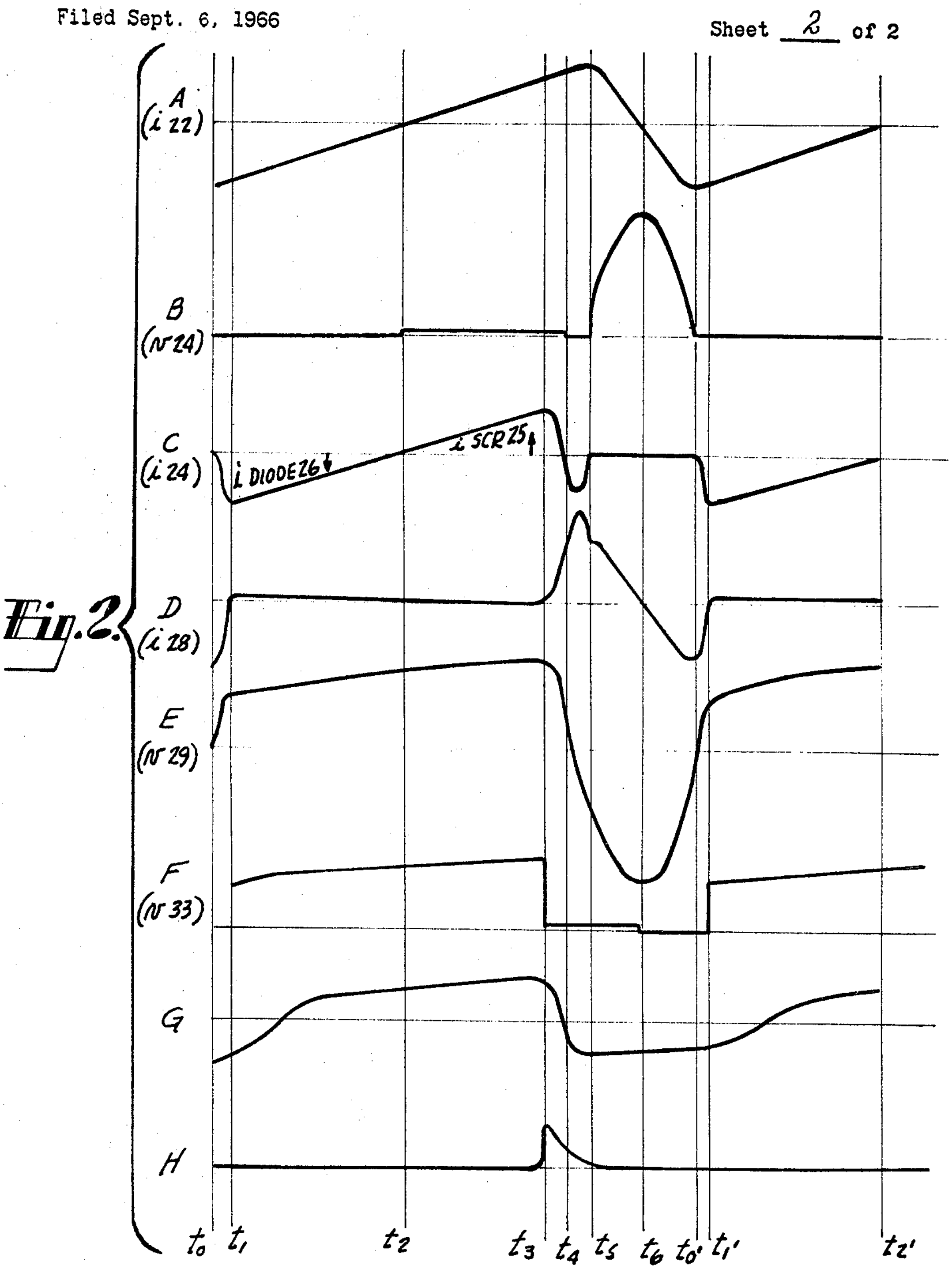

The novel features that are considered characteristic of this invention are set forth with particularity in the appended claims. The invention, itself, however, both as to its organization and method of operation, as well as additional objects and advantages thereof, will best be understood from the following description when read in connection with the accompanying drawing, in which:

FIGURE 1 is schematic circuit diagram partially in block diagram form, of a television receiver embodying the invention; and FIGURE 2 is a series of waveform diagrams (not drawn to scale) to which reference will be made in the explanation of the operation of the circuit of FIGURE 1.

Referring now to FIGURE 1 of the drawing, an embodiment of the invention will be described as it may be used in a typical television receiver. The television receiver includes an antenna 10 which receives composite television signals and couples the received signals to a tuner-second detector 11. The tuner-second detector 11 normally includes a radio frequency amplifier, a frequency converter for converting the radio frequency signals to intermediate frequency signals, an intermediate frequency amplifier and a detector for deriving composite television signals from the intermediate frequency signals. The television receiver further includes a video amplifier 12.

The amplified image brightness-representative portion of the composite television signal produced by video amplifier 12 is applied to the control electrode (e.g., the cathode) of a television kinescope 13. The composite television signal is also applied from video amplifier 12 to a synchronizing signal separator circuit 14. The sync separator circuit 14 supplies vertical synchronizing pulses to a vertical deflection signal generator 15. Vertical deflection signal generator 15 is connected to a vertical deflection output circuit 16, terminals Y–Y′ of which are connected to a vertical deflection winding 17 associated with kinescope 13.

Horizontal synchronizing pulses are derived from sync separator circuit 14 and are supplied to a phase detector 18, the latter also being supplied with a second signal related in time occurrence to the operation of a horizontal oscillator 19. An error voltage is developed in phase detector 18 and applied to horizontal oscillator 19 to synchronize the output of the latter with the horizontal synchronizing pulses. The output developed by horizontal oscillator 19 is supplied by means of a transformer 20 to a horizontal deflection circuit 21 constructed in accordance with the present invention.

Deflection circuit 21 serves to produce in a horizontal deflection winding 22 a sawtooth deflection current waveform having a trace portion and a retrace portion. In deflection circuit 21, a first source of or means for supplying electrical energy comprising a capacitor 23, across which there is developed a relatively constant voltage, is coupled to deflection winding 22 during the trace portion of the deflection cycle by means of a controllable bidirectionally conductive switching means 24. Switching means 24 comprises the parallel combination of a silicon controlled rectifier (SCR) 25 and a damper diode 26, diode 26 being arranged to conduct current in a direction opposite to the direction of conduction of SCR 25. The deflection circuit 21 further comprises a second source of or means for supplying electrical energy including a relatively large inductor 27 coupled to a main B+ voltage supply (e.g., +150 volts) provided in the television receiver. Reactive circuit means comprising the series combination of an inductance 28 and a capacitance 29 is coupled between inductor 27 and one terminal of switching means 24.

Circuit means comprising a winding 30 inductively associated with inductor 27, a resistor 31 and a capacitor 32 is coupled to the gate electrode of SCR 25 for rendering SCR 25 conductive during the trace portion of each deflection cycle as will be explained more fully below.

A second controllable bidirectionally conductive switching means 33 is coupled between the junction of inductors 27 and 28 and a point of reference voltage (i.e., ground). The switching means 33, like switching means 24, comprises the parallel combination of a silicon controlled rectifier (SCR) 34 and an energy recovery diode 35, diode 35 being arranged to conduct current in a direction opposite to the direction of conduction of SCR 34.

Circuit means are provided, as will be explained more fully below, for rendering switching means 33 conductive prior to the retrace portion of each deflection cycle. This latter circuit means comprises the transformer 20 via which the output of horizontal oscillator 19 is coupled to the gate electrode of SCR 34.

A capacitive divider 36 having first and second capacitors **36*a* and 36*b* is coupled across the combination of capacitor 23 and deflection winding 22. The junction point of capacitors 36*a* and 36*b* is coupled to phase detector 18 to provide flyback or retrace pulses to phase detector 18 for controlling the operation of oscillator 19**.

In the operation of the receiver shown in FIGURE 1, a television signal at radio frequency is received by antenna 10. The received signal is amplified, converted to an intermediate frequency, further amplified and then detected by means of tuner-second detector 11. The image-representative portions of the signal are then amplified in video amplifier 12 and amplified video signals are applied to kinescope 13. The detected television signal also is applied to synchronizing signal separator circuit 14. Sync separator circuit 14 separates the deflection synchronizing signals from the composite television signal and supplies vertical synchronizing signals to vertical deflection signal generator 15 and horizontal synchronizing signals to phase detector 18. Output pulses generated by vertical deflection signal generator 15 are supplied to vertical deflection output circuit 16 which, in turn, supplies a suitable sawtooth of current at field frequency to the vertical deflection winding 17 coupled across terminals Y–Y'.

Retrace pulses generated across capacitor **36*b* of divider 36, which are related in time occurrence to the signals generated by horizontal oscillator 19 (at a nominal frequency of 15,750 cycles per second) are applied to phase detector 18. The retrace pulses (or a waveform derived therefrom) are compared in phase detector 18 with the horizontal synchronizing pulses supplied from sync separator circuit 14. Phase detector 18 develops an error voltage which, in turn, is applied to horizontal oscillator 19** to control the oscillator phase and frequency.

The horizontal output pulses produced by oscillator 19 are shaped so as to provide positive pulses having, for example, a width of 3 to 7 microseconds, a repetition rate of 15,750 cycles per second and a predetermined time relationship, as will be pointed out more fully below, with respect to the horizontal blanking or retrace interval.

The positive pulses so formed are coupled to the gate electrode of silicon controlled rectifier 34. The silicon controlled rectifier 34, as will be described more fully below, initiates a sequence of events which results in producing the retrace portion of the horizontal deflection cycle each time a pulse is applied to the gate electrode.

Referring to FIGURE 2, current and voltage waveforms at various points in the circuit of FIGURE 1 are shown as they appear during each deflection cycle. The trace portion of a deflection cycle is indicated as occurring during the time interval $t_0$ to $t_5$ while the retrace portion of the cycle occurs during the interval $t_5$ to $t_0'$. Typically, the interval $t_0$ to $t_5$ is about 53 microseconds in duration while the interval $t_5$ to $t_0'$ is about 10.5 microseconds in duration.

In the horizontal deflection circuite 21, the operation of the first or trace switching means 24 now will be considered. The trace switching means 24 is intended to operate to connect a constant voltage supply (capacitor 23) of the deflection cycle. Specifically, beginning at the time across deflection winding 22 throughout the trace portion $t_0$ (start of trace), the current in deflection winding 22 (waveform A) is at a maximum amplitude flowing in the direction within winding 22, for example, from terminal X to terminal X'. The voltage across the combination of winding 22 and capacitor 23 (waveform B) then passes through zero and reverses. As this voltage reverses, the diode 26 in the first or trace switching means 24 is biased for conduction, applying the substantially constant voltage (e.g., +50 volts) developed across capacitor 23 to the deflection winding 22. As a result, during the first half of the trace portion of the deflection cycle ($t_0$ to $t_2$), the current in deflection winding 22 (waveform A) declines in a substantially linear manner towards zero, thereby supplying energy to capacitor 23. Capacitor 23 is chosen sufficiently large so that the voltage across such capacitor does not change appreciably. Approximately midway through the trace portion of the cycle (i.e., at time $t_2$), the current through deflection winding 22 reverses and switches from damper diode 26 to SCR 25. In preparation for this switching of current paths, SCR 25 is placed in a "standby" condition during the first half of trace by means of a gate signal (waveform G) provided via winding 30, resistor 31 and capacitor 32.

The manner in which the gate signal is produced will be explained below. The polarity of the portion of the gate signal occurring during trace is arranged to enable conduction in SCR 25 when the main (anode-cathode) conduction path is forward biased. This latter condition takes place approximately midway through trace (e.g., at $t_2$) so that deflection current is transferred from diode 26 to SCR 25 at that time. The deflection current in winding 22 then increases in a substantially linear manner during the latter half of trace as such current passes through SCR 25. Energy is extracted from capacitor 23 and transferred to deflection winding 22 during this interval.

In order to terminate the trace portion of the deflection cycle and initiate the retrace portion thereof, SCR 25 must be rendered non-conductive (turned off). An SCR may be turned off by reversing the direction of current flow in the main (anode-cathode) current path and by applying a reverse voltage to the anode-cathode junction for a sufficient interval to remove all stored charge carriers from such junction. In deflection circuit 21, the above operation should take place without disrupting the desired smooth transition from the substantially linear trace current to the reversal of direction thereof during retrace.

Approximately five microseconds before the end of the trace portion of each deflection cycle (i.e., at $t_3$), a horizontal output pulse (waveform H) produced by oscillator 19 is applied to the gate electrode of SCN 34 to initiate a sequence of events leading to the occurrence of the retrace portion of the deflection cycle. Specifically, when SCR 34 is triggered into conduction by oscilator 19, a closed circuit path comprising the first switching means 24, second switching means 33, inductor 28 and capacitor 29 is completed. The current in deflection winding 22 continues to increase linearly since switch 24 remains closed. At the same time, substantial energy which, as will be explained below, previously has been stored in capacitor 29 is circulated in the above-mentioned closed circuit path at a resonant frequency determined by the combination of capacitor 29 and inductor 28. Initially, current (waveform D) flows in the closed circuit path in the forward direction through SCR 34 and in the reverse direction through SCR 25, the latter being possible since a substantial forward current (that of winding 22) also is flowing through SCR 25. The resonant current, however, increases more rapidly than the deflection current so that, after a predetermined time interval (e.g., 2–3 microseconds) the net current through SCR 25 reverses (see waveform C). SCR 25 is therefore turned "off." The resonant current, which continues to increase, then switches to diode 26 for a short interval until the deflection and resonant currents are again equal. At that time, diode 26 and SCR 25 both are switched "off" (i.e., to high impedance state) thereby "disconnecting" winding 22 from the constant trace voltage supply (i.e., capacitor 23). The retrace interval commences at this time ($t_5$).

The time interval ($t_4$ to $t_5$) during which current passes through diode 26 is arranged to be of sufficient duration to permit the removal of all stored carriers in SCR 25 thereby insuring that SCR 25 will remain "off" until the required standby trigger is applied to its gate electrode during the trace portion of the succeeding deflection cycle.

During retrace, switch 33 acts to couple the reactive components comprising inductor 28, capacitor 29 and deflection winding 22 in a series resonant circuit. Capacitor 23, because of its large value, may be neglected in this discussion. The resonant period of the three components is selected twice as great as the desired retrace interval. Therefore, the current in deflection winding 22 will pass through one-half cycle of oscillation, thereby accomplishing the desired reversal of direction of such current and the consequent retrace of the electron beam in kinescope 13. Since SCR 34 is a unidirectionally conductive device, diode 35 is coupled across SCR 34 to render switching means 33 bidirectionally conductive, thereby permitting the reversal of deflection current. When the current through switch 33 reverses (i.e., at $t_6$), SCR 34 is rendered nonconductive. The duration of the flow of current through diode 35 (about half a retrace time) is more than adequate to insure removal of all carriers from SCR 34 thereby insuring proper turnoff of SCR 34.

The energy exchange relationships which exist during retrace and immediately thereafter are of particular interest and will now be discussed, including the manner in which energy is stored in capacitor 29 preparatory to initiating retrace.

At the beginning of retrace ($t_5$), the currents in deflection winding 22 and inductor 28 are substantial and equal (any difference is rapidly eliminated since both components are in series at this time). Such currents are representative of energy stored in these inductive components. At the same time, since the current in inductor 28 and capacitor 29 has decreased from its peak value (waveform D) and some voltage exists across capacitor 29 (waveform E), it is evident that capacitor 29 also stores some energy at the beginning of retrace.

When switch 24 is opened (at $t_5$), the energy stored in deflection winding 22 and inductance 28 is transferred into capacitor 29 during the first half of retrace and then all of the energy stored in capacitor 29, including that which was stored at the beginning of retrace, is returned to the deflection winding 22 and inductance 28 during the second half of retrace. At the end of retrace, there is substantially no energy stored in capacitor 29.

During the entire retrace interval, and immediately preceding such interval (i.e., including $t_3$ to $t_0'$), the second switching means 33 is closed, thereby coupling inductance 27 directly across the B+ voltage supply. During this time, the current in inductor 27 increases in a substantially linear manner resulting in the storage of substantial energy in inductor 27.

At the end of retrace (at $t_0'$), diode 26 is once again forward biased as the voltage across deflection winding 22 completes substantially one-half cycle of oscillation.

As diode 26 is switched "on," the current in deflection winding 22 again returns to the linearly varying waveform. At the same time, the residual energy stored in inductor 28 (see waveform D) is transferred rapidly ($t_0'$ to $t_1'$) to capacitor 29 via diodes 26 and 35. At the end of this last-mentioned energy transfer, diode 35 (and therefore switch 33) opens. It should be noted that switch 33 has remained closed during the interval $t_3$ to $t_1'$. Inductor 27 then commences to discharge into capacitor 29 via the trace switch 24 (see voltage waveform E). Sufficient energy is transferred into capacitor 29 from inductor 27 during the interval $t_1$ to $t_3$ to replenish circuit losses occurring during the preceding deflection cycle. This energy is then supplied by capacitor 29 primarily to winding 22 during retrace as was mentioned above.

The gating signal (waveform G) applied to SCR 25, which was described in general terms above, is produced in the following manner. The voltage across inductor 27 and therefore the voltage across inductor 30, is in the form of a square wave with transitions occurring near the beginning (i.e., at $t_1$) and near the end (i.e., $t_3$) of trace as the switches 33 and 24 change state (see waveform F). After filtering in the network comprising resistor 31 and capacitor 32, the square wave is modified for application to the gate electrode of SCR 25 to provide a wave having relatively slowly increasing and slowly decreasing portions. As was mentioned above, the polarity of the major portion of the wave occurring during trace is selected to enable conduction in SCR 25 when the main (anode-cathode) path of SCR 25 is forward biased.

The gating signal applied to SCR 25 may, of course, be derived in several different ways. For example, this gating signal may be provided by oscillator 19 just as the gating signal applied to SCR 34 is provided.

In order to permit adjustment of the operating time intervals, components in the circuit (e.g., inductor 28) may be made variable.

High voltage generation circuitry (not illustrated) for development of the high voltage required by the ultor electrode of kinescope 13 may be associated with deflection circuit 21 in a variety of ways. Illustratively, the primary winding of a high voltage flyback transformer may be effectively shunted across switching means 24, with stepped-up flyback pulses, derived from a secondary winding of the transformer, applied to a high voltage rectifier to develop the unidirectional ultor potential.

A circuit of the type shown in FIGURE 1 utilizing the following component values has been built and tested.

| | |
|---|---|
| Deflection winding **22** | 1.1 millihenries. |
| Capacitor **23** | 1 microfarad. |
| SCR **25** | RCA type TA2688. |
| Diode **26** | General Instrument type RG100G. |
| Inductor **27** | 40 millihenries. |
| Inductor **28** | 150 microhenries. |
| Capacitor **29** | 0.015 microfarad. |
| SCR **34** | RCA type TA2688. |
| Diode **35** | General Instrument type RG100G. |

What is claimed is:

1. In a television receiver, an electron beam deflection circuit for producing a sawtooth deflection current waveform having a trace portion and a retrace portion, the circuit comprising:

a beam deflection winding, a first means for supplying electrical energy, a first controllable bidirectionally conductive switching means for coupling said first energy supplying means to said winding, a second means for supplying electrical energy, reactive circuit means coupled to said second energy supplying means for storing energy transferred from said second energy supplying means, and second controllable switching means selectively operable for completing a circuit comprising said reactive circuit means and said first and second switching means to effect transfer of energy via said reactive circuit means to said first switching means to initiate the retrace portion of said deflection current waveform and subsequently to transfer energy to said second switching means to terminate said retrace portion.

2. In a television receiver, an electron beam deflection circuit according to claim 1 wherein:

said second controllable switching means comprises a retrace initiating controlled rectifier arranged for conduction through said reactive circuit means and said first switching means in a direction opposite to the direction of conduction of deflection current through said first switching means at the end of the trace portion of each deflection cycle.

3. In a television receiver, an electron beam deflection circuit according to claim 2 and further comprising:

means for rendering said first switching means conductive during said trace portion to couple said deflection winding to said first energy supplying means, and means for rendering said second switching means conductive prior to and during said retrace portion to transfer energy from said reactive circuit means to said first switching means.

4. In a television receiver, an electron beam deflection circuit according to claim 3 wherein:

said first switching means comprises the parallel combination of a first controlled rectifier and a first diode coupled together in oppositely conductive directions, and said second switching means being selectively operable in conjunction with said reactive circuit means to effect reversal of current through said first controlled rectifier at the end of the trace portion of each deflection cycle and thereby render said first controlled rectifier nonconductive.

5. In a television receiver, an electron beam deflection circuit according to claim 4 wherein:

said reactive circuit means comprises a series combination of inductance and capacitance coupled to said second energy supplying means.

6. In a television receiver, an electron beam deflection circuit according to claim 5 wherein:

said first energy supplying means comprises a first voltage supply and said second energy supplying means comprises a first energy storage inductance coupled to a second voltage supply.

7. In a television receiver, an electron beam deflection circuit according to claim 6 wherein:

said first voltage supply comprises a relatively large capacitor for storing sufficient charge to maintain a relatively constant voltage across said deflection winding during the trace portion of each deflection cycle.

8. In a television receiver, a deflection circuit comprising:

a first series circuit having
- a deflection voltage supply,
- a deflection winding,
- a first controllable bidirectionally conductive switching means for completing and interrupting said first series circuit, a second series circuit having:
- a second voltage supply,
- an energy storage inductance,
- a second controllable switching means for completing and interrupting said second series circuit, reactive circuit means coupling said first series circuit to said second series circuit for transferring energy to said first and second switching means periodically to interrupt said first and second series circuits, and triggering means coupled to said first and second switching means for periodically completing said series circircuits.

9. In a television receiver, a deflection circuit according to claim 8 for producing a bidirectional sawtooth current waveform having trace and retrace portions wherein:

said first switching means comprises the parallel combination of a first controlled rectifier and a first diode coupled together in oppositely conductive directions for passing a bidirectional trace current to said deflection winding.

10. In a television receiver, a deflection circuit according to claim 9 wherein:

said first diode is arranged for conduction of deflection current in a first direction through said deflection winding during the first half of said trace portion, and said triggering means comprises means for rendering said first controlled rectifier conductive during the latter half of said trace portion of each deflection cycle to pass deflection current in a second direction through said deflection winding.

11. In a television receiver, a deflection circuit according to claim 10 wherein:

said reactive circuit means comprises a series resonant combination of a second inductance and a capacitance for storing and transferring energy to said first and second series circuit.

12. In a television receiver, a deflection circuit according to claim 11 wherein:

said second switching means comprises a second controlled rectifier arranged for conduction through said reactive circuit means and said first switching means in a direction opposite to the direction of conduction of deflection current through said first rectifier during the latter half of the trace portion of each deflection cycle.

13. In a television receiver, a deflection circuit according to claim 12 wherein:

said second switching means further comprises a second diode coupled in parallel with said second rectifier in an oppositely conductive direction.

14. In a television receiver, a deflection circuit according to claim 13 wherein:

said reactive circuit means is selected to provide sufficient energy, upon conduction of said second rectifier, to reverse the direction of current through said first rectifier.

15. In a television receiver, a deflection circuit according to claim 14 wherein:

The natural resonant period of the combination of said deflection winding and said reactive circuit means is selected substantially twice as great as said retrace interval.

16. In a television receiver, a deflection circuit according to claim 15 wherein:

said triggering means is arranged to initiate conduction in said second controlled rectifier during the latter half of the trace interval but before commencement of the retrace interval.

17. In a television receiver, a deflection circuit according to claim 16 wherein:

the resonant period of said reactive circuit means is selected with respect to the interval between initiation of conduction in said second rectifier and commencement of retrace to cause two successive reversals of direction of current through said first switching means within said last-named interval.

18. In a television receiver, a deflection circuit according to claim 17 wherein:

said first switching means is arranged to connect said energy storage inductance to said reactive circuit means during at least a part of the trace portion of each deflection cycle for effecting transfer of energy from said inductance to said reactive circuit means.

19. In a television receiver, a deflection circuit according to claim 18 wherein:

said deflection voltage supply comprises a relatively large capacitor for storing sufficient charge to maintain a relatively constant voltage across said deflection winding during the trace portion of each deflection cycle.

20. In a television receiver, a deflection circuit for producing a sawtooth deflection current waveform having trace and retrace portions, the deflection circuit comprising:

a deflection winding, first energy storage means for providing a substantially constant voltage, a first and second switching means operable between conductive and nonconductive states for coupling said deflection winding to said first energy storage means substantially throughout the trace portion of each deflection cycle, reactive circuit means coupled between said first and second switching means for providing energy to initiate transfer of each of said switching means from said conductive to said nonconductive state, means for rendering said first switching means conductive throughout said trace portion, and means for rendering said second switching means conductive throughout an interval including said retrace portion and a segment of said trace portion immediately adjacent said retrace portion.

21. In a television receiver, a deflection circuit according to claim 20 wherein:

said reactive circuit means comprises the resonant combination of inductance and capacitance.

22. In a television receiver, a deflection circuit according to claim 21 wherein:

said second switching means is rendered conductive during the latter half of said trace portion and remains conductive throughout said retrace portion.

23. In a television receiver, a deflection circuit according to claim 22 wherein:

said first and second switching means are bidirectionally conductive.

24. In a television receiver, a deflection circuit for producing a sawtooth deflection current waveform having trace and retrace portions, the deflection circuit comprising:

a deflection winding, first energy storage means for providing a substantially constant voltage, first switching means operable between conductive and nonconductive states for coupling said deflection winding to said energy storage means substantially throughout the trace portion of each deflection cycle, second switching means operable between conductive and nonconductive states, reactance circuit means coupled between said first and second switching means for providing energy to initiate transfer of each of said switching means from said conductive to said nonconductive states, and means for rendering said second switching means conductive during said trace portion immediately preceding said retrace portion to effect transfer of said first switching means from conductive to nonconductive state and thereby initiate said retrace portion.

References Cited

UNITED STATES PATENTS 3,300,680 1/1967 Saudinaitis ___________ 315—27

RICHARD A. FARLEY, *Primary Examiner.*

J. G. BAXTER, *Assistant Examiner.*

UNITED STATES PATENT OFFICE

CERTIFICATE OF CORRECTION

Patent No. 3,449,623 Dated 6/10/69

Inventor(s) Wolfgang F. Dietz

It is certified that error appears in the above-identified patent and that said Letters Patent are hereby corrected as shown below:

For column 4, line 13, substitute column 4 line 14; and for column 4, line 14, substitute column 4 line 13.

SIGNED AND SEALED DEC 22 1970

(SEAL)
Attest:

Edward M. Fletcher, Jr.
Attesting Officer

WILLIAM E. SCHUYLER, JR.
Commissioner of Patents

FORM PO-1050 (10-69)

USCOMM-DC 60376-P69